(12) United States Patent
Jeon et al.

(10) Patent No.: US 7,530,010 B2
(45) Date of Patent: May 5, 2009

(54) HYBRID TRACE BACK APPARATUS AND HIGH-SPEED VITERBI DECODING SYSTEM USING THE SAME

(75) Inventors: In-San Jeon, Daejon (KR); Hyuk Kim, Daejon (KR); Kyung-Soo Kim, Daejon (KR); Ik-Soo Eo, Daejon (KR); Hee-Bum Jung, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 598 days.

(21) Appl. No.: 11/263,443

(22) Filed: Oct. 31, 2005

(65) Prior Publication Data

US 2006/0136802 A1 Jun. 22, 2006

(30) Foreign Application Priority Data

Dec. 17, 2004 (KR) .................... 10-2004-0108282

(51) Int. Cl.
*H03M 13/03* (2006.01)
(52) U.S. Cl. .................. 714/792; 714/791; 714/794; 714/795; 714/796; 375/262; 375/265; 375/341; 702/9
(58) Field of Classification Search ......... 714/791–792, 714/794–76; 375/262, 265, 341; 369/59.22; 702/9
See application file for complete search history.

(56) References Cited

U.S. PATENT DOCUMENTS 6,732,326 B2   5/2004   Choi et al.
6,792,570 B2   9/2004   Takahashi et al.
2003/0123579 A1   7/2003   Safavi et al.
2004/0122883 A1   6/2004   Lee et al.
2007/0076824 A1*  4/2007   Graef ..................... 375/341

FOREIGN PATENT DOCUMENTS

EP    1111863       6/2001
JP    2001 230682   8/2001
KR    1020000049852 8/2000

(Continued)

OTHER PUBLICATIONS

"An Efficient In-Place VLSI Architecture for Viterbi Algorithm," Yun-Nan Chang, Journal of VLSI Processing 33, pp. 317-324, © 2003.

(Continued)

*Primary Examiner*—Guy J Lamarre
(74) *Attorney, Agent, or Firm*—Ladas & Parry LLP

(57) ABSTRACT

A hybrid trace back apparatus and a high-speed Viterbi decoding system having the same are disclosed. The hybrid trace back apparatus includes: a register exchanging unit for receiving survivor values of each states from a path metric calculator, and obtaining a block survival value through a register exchange operation as much as a bit length for a block trace back operation; a first storing unit for the register exchange operation; a second storing unit for storing the block survival value obtained through the register exchange operation until the block survival value is written in a block trace back memory; and a block trace back unit for outputting decoded data by performing a block trace back operation while writing a value of the second storing unit.

9 Claims, 12 Drawing Sheets

FOREIGN PATENT DOCUMENTS

KR 1020010106608 12/2001

OTHER PUBLICATIONS

"High Speed Low Power Architecture for Memory Management in a Viterbi Detector," Emmanuel Boutillon et al, Circuits and Systems, 1996, ISCAS '96, 'Connecting the World'., 1996 IEEE International Symposium on, vol. 4, pp. 284-287, © 1996 IEEE.

Korean Patent Grant dated May 23, 2007 for the corresponding Korean application No. 10-2004-0108282.

* cited by examiner

HYBRID TRACE BACK APPARATUS AND HIGH-SPEED VITERBI DECODING SYSTEM USING THE SAME

FIELD OF THE INVENTION

The present invention relates to a hybrid trace back apparatus and a high-speed Viterbi decoding system using the hybrid trace back apparatus; and, more particularly, to a hybrid trace back apparatus and a high-speed viterbi decoding system using the same for improving a size of hardware and optimizing a performance and a power consumption by applying a hybrid method which is combined with a register exchange method and a trace back method when a fully parallel add compare select (ACS) structure is used for high-speed communication and a radix4 is used for optimizing a critical path instead of using a radix2.

DESCRIPTION OF THE PRIOR ART

High-speed transmission is a major requirement of wireless communication system to support multimedia data such as moving images. There are various studies in progress for developing the high-speed transmission after a third generation communication technology is introduced. An error correction scheme is also very important requirement for the high-speed transmission. A convolution encoding scheme or a turbo encoding scheme has been selected in communication standards for the error correction. A low density parity check code (LDPC) has been also theoretically studied for the error correction, and several embodiments of the LDPC are introduced recently. A serial Viterbi decoder is generally used for a communication system having a comparative low transmission rate. However, it expects that a parallel Viterbi decoder will be used for a high-speed communication in near future because of a complexity of a turbo decoder.

Hereinafter, application fields of the present invention and the related art of the present invention will be described.

A 802.11g standard for wireless local area network (WLAN) supports a transmission rate of 54 Mbps, and it expects that a 802.11n standard will support a transmission rate of 155 Mbps in a MAC layer. The 802.11g standard is a combination of 802.11a standard and a 802.11b standard. Such a wireless LAN system uses a convolutional code and a Viterbi decoder for error correction since a mobility is not considered in the wireless LAN system.

Although a mobile communication system uses a convolutional code having a constraint length of 9, a wireless LAN uses a convolutional code having a constraint length of 7. Generally, a complexity of Viterbi decoder grows in proportional to $2^K$ according to the increase of a constraint length of K.

A Viterbi decoder with a pair of add compare select (ACS) is conventionally used in a low-speed communication system. However, a Viterbi decoder with a plurality of ACS pairs connected in various parallel forms is used according to the increase of the transmission rate. Recently, a high-speed wireless LAN uses a Viterbi decoder with fully parallel ACS pairs, where the number of the ACS pairs is as many as the number of convolutional code states. Furthermore, a Radix4 is selected instead of a Radix2 to additionally increase a transmission rate of the communication system.

Meanwhile, there are two kinds of trace methods, which are a resister exchange method and a trace back method.

The register exchange method (RE) is not generally used since it commonly uses a lot of hardware. Accordingly, a modified register exchange method is widely used.

The trace back method is classified into a bit trace back scheme and a block trace back (BTB) scheme.

The bit trace back scheme must read a memory as many as a trace back depth by performing a trace back operation in a unit of bit. The bit trace back scheme is also classified into a scheme using a single point and another scheme using multiple points to improve a speed of trace back operation. On the contrary, a block trace back scheme reads data in the memory fewer times than the bit trace back scheme because the block trace back scheme performs the trace back operation in a unit of a block with several bits.

A hybrid trace back method is a trace back method combined with the register exchange method and the trace back method.

A first conventional hybrid trace back technology is introduced in an article entitled "High speed low power architecture for memory management in a Viterbi decoder", *IEEE international symposium on Circuits and system*, pp 284 to 287, Vol4, 12-15, May, 1996.

The first conventional hybrid trace back technology performs a trace back operation based on a block trace back scheme by changing an output of ACS using a register exchange method. With a constraint length of 3, the first conventional hybrid trace back technology performs conceptually a trace back operation based on the hybrid trace back method. In the first conventional hybrid trace back technology, however, the trace back method is not described in detail. Also, the first conventional hybrid trace back technology performs a trace back operation based on a block trace back scheme using single point. As an example of the first conventional hybrid trace back method, a block trace back operation of 4 bits is shown in FIG. 1.

FIG. 1 shows a hybrid trace back structure when a constraint length is 3. However, the first conventional hybrid trace back method may not be usable when the constraint length is large, for example, 7 or 9.

The second conventional hybrid trace back technology is introduced in an article entitled "An Efficient In-Place VLSI Architecture for Viterbi Algorithm," *Journal of VLSI Processing* 33, pp 317 to 324, 2003. The second conventional hybrid trace back technology is embodied by connecting a path metric and a register exchange method closely to a path metric calculation with constraint length of 6. Accordingly, the second conventional hybrid trace back technology has an advantage of reducing a volume compared to the first conventional hybrid trace back method. Also, the second conventional hybrid trace back technology includes ACSs configured in a partial parallel and other ACSs configured in partial serial using characteristics that a state of a trellis diagram is returned back to original state after a predetermined stage. The trellis diagram is states of finite state machine along with time. Such a structure of the second trace back method is shown in FIG. 2.

As shown in FIG. 2, the second trace back method includes a partial parallel ACS structure and a register exchange is operated in close connection with ACSs. That is, the second trace back method is not use a fully parallel ACS structure. Also, the second trace back method does not clearly disclose a structure for trace back using a memory. Only, Radix2 is described.

The third conventional technology is introduced in U.S. Pat. No. 6,732,326 entitled "Structure and methods for de-puncturing punctured codes for Radix-4 branch metric calculation in high-speed Viterbi decoder." The third conventional trace back method introduces a block for processing a puncturing and a block for calculating a branch matrix. A trace back method is not introduced by the third conventional technology.

The fourth conventional technology is introduced in U.S. Pat. No. 6,792,570 entitled "Viterbi decoder with High speed processing unit." The fourth conventional technology introduces a high speed Viterbi decoder using a Radix2, and uses multiple points for a trace back operation. However, a trace back method is not introduced by the fourth conventional technology.

SUMMARY OF THE INVENTION

It is, therefore, an object of the present invention to provide a hybrid trace back apparatus and a high-speed Viterbi decoder using the same for improving a size of hardware and optimizing a performance and a power consumption by applying a hybrid method which is combined with a register exchange method and a trace back method when a fully parallel ACS is used for high-speed communication and a radix4 is used for optimizing a critical path instead of using a radix2.

In accordance with an aspect of the present invention, there is provided a hybrid trace back apparatus having a fully parallel add compare select (ACS) structure using a Radix4, the hybrid trace back apparatus including: a register exchanging unit for receiving a branch of a path metric, which is a survival path, from a path metric calculator, and obtaining a block survival value through a register exchange operation as much as a bit length for a block trace back operation; a first storing unit for the register exchange operation; a second storing unit for storing the block survival value obtained through the register exchange operation until the block survival value is written in a block trace back memory; and a block trace back unit for outputting decoded data by performing a block trace back operation while writing a value of the second storing unit.

The hybrid trace back apparatus further includes: a first pre trace back unit for receiving a trace back pointer (TBP) provided from the path metric calculator, calculating a first trace back pointer (TBP1) using a block survival value stored in the first storing unit, and outputting the TBP1; and a second pre trace back unit for receiving the TBP1 from the first pre trace back unit, calculating a second trace back pointer (TBP2) using a block survival value stored in the second storing unit, and providing the TBP2 to the block trace back unit.

In accordance with another aspect of the present invention, there is provided a hybrid trace back apparatus having a fully parallel add compare select (ACS) structure using a Radix4, which includes: a register exchanging unit for receiving survivor values of each states, from a path metric calculator, and obtaining a block survival value through a register exchange operation as much as a bit length for a block trace back operation; a storing unit for storing and outputting a block survival value to perform the register exchange operation, and storing the block survival value obtained through the register exchange operation until the block survival value is written in a block trace back memory; and a block trace back unit for outputting decoded data by performing a block trace back operation while writing a value of the second storing unit.

The hybrid trace back apparatus further includes a pre trace back unit for receiving a trace back pointer (TBP) provided from the path metric calculator, calculating a first trace back pointer (TBP1) using a block survival value in the storing unit and outputting the TBP1 to the block trace back unit.

In accordance with yet another aspect of the present invention, there is provided a high-speed Viterbi decoder for performing a trace back operation including a hybrid trace back apparatus, wherein the hybrid trace back apparatus has: a register exchanging unit for receiving a branch of a path metric, which is a survival path, from a path metric calculator, and obtaining a block survival value through a register exchange operation as much as a bit length for a block trace back operation; a first storing unit for the register exchange operation; a second storing unit for storing the block survival value obtained through the register exchange operation until the block survival value is written in a block trace back memory; and a block trace back unit for outputting decoded data by performing a block trace back operation while writing a value of the second storing unit, wherein the high-speed Viterbi decoder decodes a convolutional code having a constraint length of 7 or 9 through a hybrid trace back operation combined with a register exchange and a block trace back under a structure having a fully parallel add compare select (ACS) path metric using a Radix4.

BRIEF DESCRIPTION OF THE DRAWINGS

The above and other objects and features of the present invention will become apparent from the following description of the preferred embodiments given in conjunction with the accompanying drawings, in which:

FIG. 9 shows buffering operation for high-speed trace back when a hybrid trace back apparatus using single buffer according to a third embodiment of the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
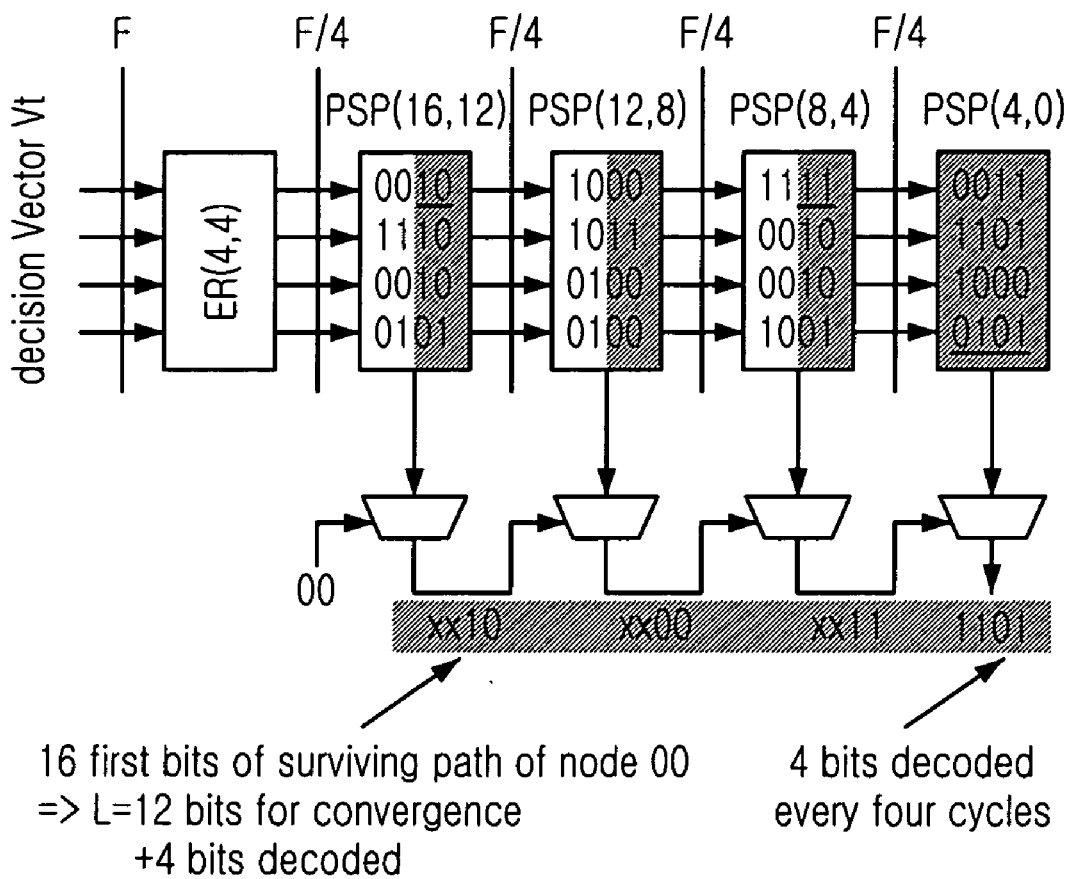
FIG. 1 is a block diagram showing a conventional hybrid trace back scheme.
Figure 2:
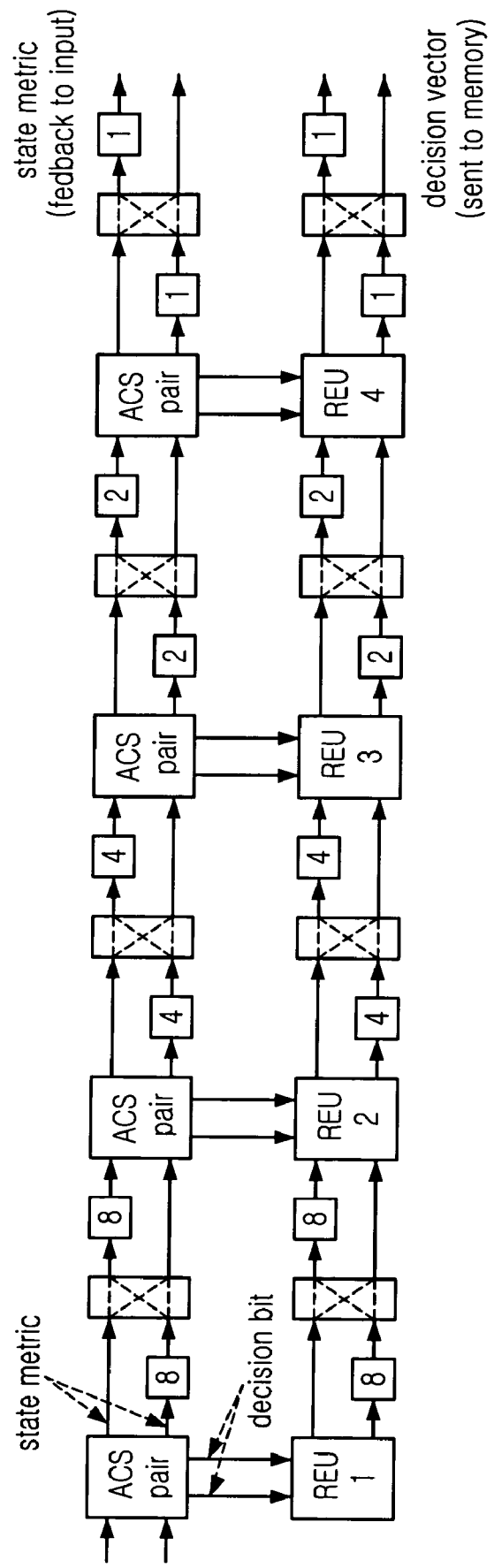
FIG. 2 is a block diagram showing a conventional hybrid trace back scheme having partially parallel ACS structure.
Figure 3:
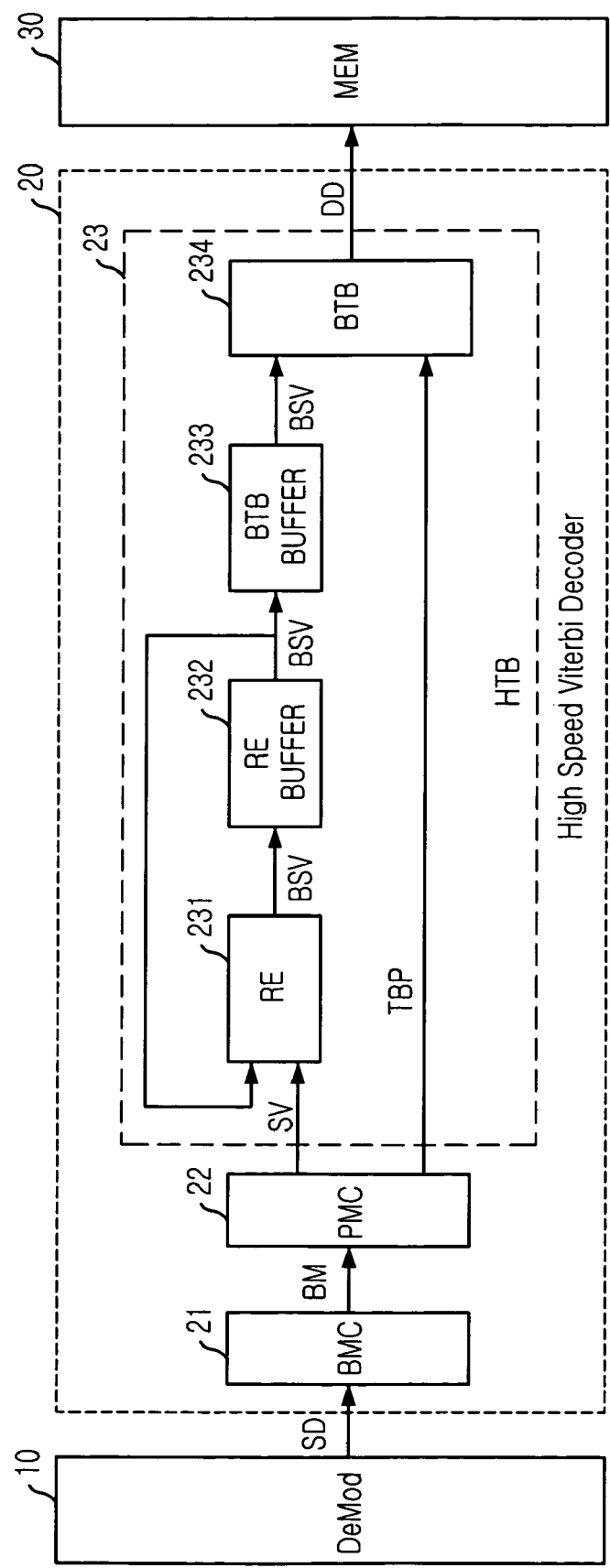
FIG. 3 is a block diagram illustrating a hybrid trace back apparatus and a high-speed Viterbi decoding system using the same in accordance with a first embodiment of the present invention.

FIG. 3 is a block diagram illustrating a hybrid trace back apparatus and a high-speed Viterbi decoding system using the same in accordance with a first embodiment of the present invention. That is, FIG. 3 shows a hybrid trace back structure having a fully parallel add compare select (ACS) structure.

Referring to FIG. 3, the high-speed Viterbi decoding system according to the present invention uses a Radix4 for high-speed processing, and includes a branch metric calculator (BMC) 21, a path metric calculator (PMC) 22, and a hybrid trace back block 23 which is a hybrid trace back apparatus according to the present invention.

The BMC 21 calculates a branch metric of each branch on the trellis diagram in a soft decision (SD) as widely known. In case of Radix4 calculation, single calculation is performed for two stages shown in the trellis diagram.

The PMC 22 performs a Radix4 calculation for each state in stage. That is, each state receives four previous path metric values and four branch metric values, adds them, and selects a smallest value among the received metric values as a new path metric (PM) of the state. Herein, the selected branch of the state is assigned as a survivor value (SV) and the minimum value among path metrics of states in stage is used as an initial value of a trace back pointer (TBP). As described above the PMC 22 calculates the SV and the TBP and transfers the SV and the TBP to the trace back block which is the hybrid trace back unit 23.

Generally, a trace back block may use a single point scheme, a multiple pointer scheme, a register exchange method, and a hybrid trace back method (HTB).

The hybrid trace back method was introduced as having a partially parallel ACS which was described in the second conventional hybrid trace back technology. However, the second conventional hybrid trace back technology does not disclose a method of performing a trace back operation in a case of the Radix4. Especially, the second conventional technology does not described a trace back operation using a memory although a use of memory is necessary to the second conventional technology when a constraint length is 7 or 9. That is, the second conventional technology cannot be embodied with using only registers when the constraint length is 7 or 9.

Therefore, the hybrid trace back according to the present invention is totally distinguishable from the conventional trace back technologies in a view that the present invention is a hybrid trace back under a structure including a path metric having a fully parallel ACS using a Radix4. Furthermore, the present invention is more clearly distinguishable in a view that the present invention is a hybrid trace back (HTB) strongly combined with a register exchange method and a block trace back (BTB) under such a condition.

The high-speed Viterbi decoding system shown in FIG. 3 has a fully parallel ACS structure for every states when the constraint length is comparative larger as described above.

As shown in FIG. 3, the hybrid trace back (HTB) 23 includes a register exchange unit (RE) 231, a register exchange unit (RE) buffer 232, a BTB buffer 233 and a block trace back unit (BTB) 234.

The hybrid track back 23 obtains a block survivor value (BSV) by exchanging registers as much as a predetermined bit length, which is as long as a bit for BTB, using the register exchange unit 231 and the RE buffer 232. Herein, the RE buffer 232 must be required since a register exchange occurs always. The stored values in the RE buffer 232 cannot be written in a block trace back memory with single time, where the block trace back memory is an inside memory of the block trace back unit 234. It must be written in the block trace back memory with several times. Therefore, the BTB buffer is required to store the BSV until values of the RE buffer 232 are written in the block trace back memory.

The block trace back unit 234 obtains a decoded data (DD) by performing a general block trace back operation while writing values of the BTB buffer 233 in a corresponding memory which is the inside memory of BTB unit 234. Since the inside memory of the BTB unit 234 is divided in a unit of block to a memory block for performing a write operation and another memory block for performing a read operation, the write operation and the block trace back operation can be simultaneously performed.

In other words, the hybrid trace back apparatus according to the first embodiment includes the register exchange unit (RE) 231 for receiving the survivor values of each states, from the path metric calculator 22, and obtaining a block survival value (BSV) through a register exchange as much as a bit length for block trace back; the RE buffer 232 for the register exchange; the BTB buffer 233 for storing the BSV obtained through the register exchange (RE) until the BSV is written in the block trace back memory of the block trace back unit 234; and the block track back unit 234 for obtaining the decoded data by performing a block trace back operation while writing the value of the BTB buffer 233 in the block trace back memory. The hybrid trace back apparatus according to the first embodiment performs a hybrid trace back scheme strongly combined with the register exchange method and the block trace back method under a structure including a path metric having a fully parallel add compare select structure using a Radix4.

Figure 4:
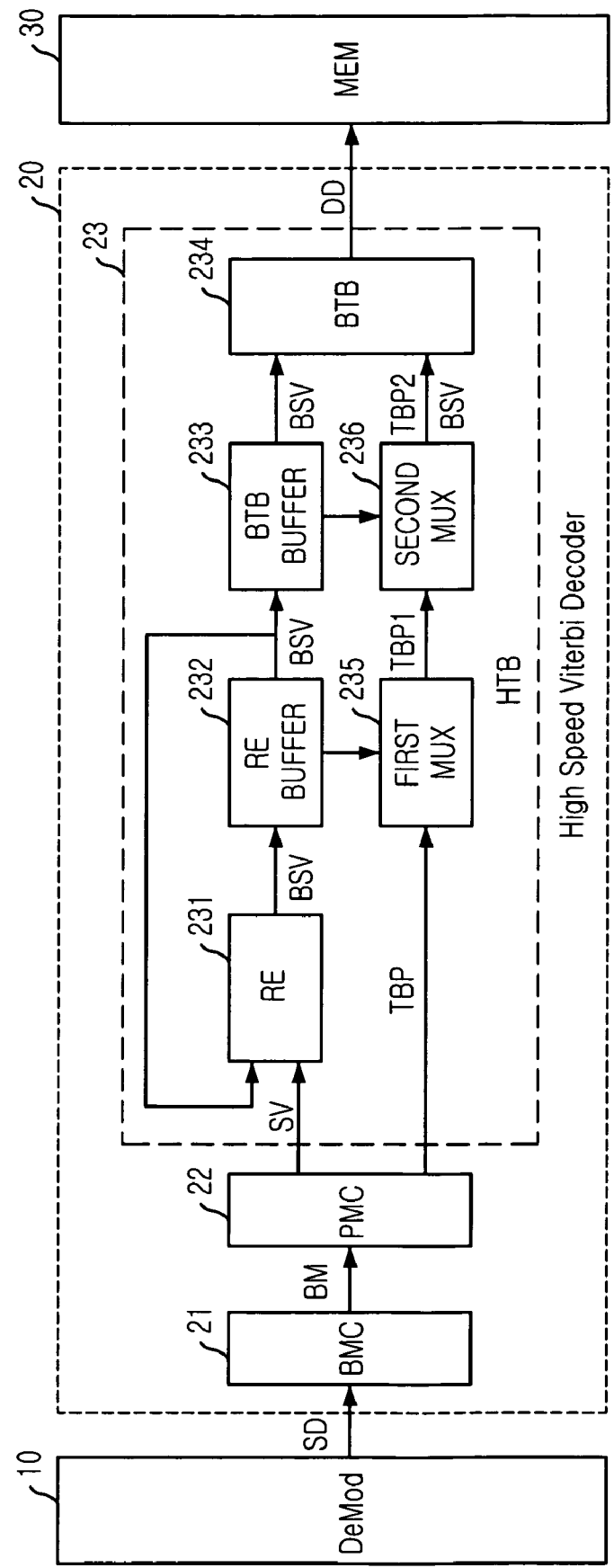
FIG. 4 is a block diagram illustrating a hybrid trace back apparatus and a high-speed Viterbi decoding system using the same in accordance with a second embodiment of the present invention.

FIG. 4 is a block diagram illustrating a hybrid trace back apparatus and a high-speed Viterbi decoding system using the same in accordance with a second embodiment of the present invention. That is, the high-speed Viterbi decoding system according to the second embodiment has an enhanced structure compared to the hybrid trace back apparatus shown according to the first embodiment shown in FIG. 3.

Advantageous characteristics of the hybrid trace apparatus and the high-speed Viterbi decoding system according to the second embodiment are as follows. A trace back operation is performed twice to reduce a delay time for decoding in the second embodiment. And, a performance is improved by using same block trace back memory, which is the inside memory of the block trace back unit 234, since a trace back depth becomes extended. As shown in FIG. 4, multiplexers 235, 236 receive a trace back point (TBP) from the path metric calculator 22, and calculate TBP1 and TBP2 using BSVs stored in the RE buffer 232 and the BTB buffer 233 respectively. Therefore, the block trace back operations are performed twice before entering the block trace back unit 234.

Accordingly, the hybrid trace back apparatus according to the second embodiment of the present invention includes a register exchange unit (RE) 231 for receiving survivor values of each states, from the path metric calculator 22, and obtaining a block survival value (BSV) through a register exchange as much as a bit length for block trace back; a RE buffer 232 for the register exchange; a BTB buffer 233 for storing the BSV obtained through the register exchange (RE) until the BSV is written in a block trace back memory of a block trace back unit 234; a first multiplexer 235 for receiving the TBP provided from the PMC 22, calculating a first trace back point (TBP1) using the BSV stored in the RE buffer 232, and outputting the TBP1; a second multiplexer 236 for receiving the TBP1 from the first multiplexer 235, calculating a second trace back pointer (TBP2) using the BSV stored in the BTB buffer 233, and providing the TBP2 to the BTB unit 234; and the block track back (BTB) unit 234 for obtaining the decoded data by performing a block trace back operation while writing the value of the BTB buffer 233 in the block trace back memory. The first multiplexer 235 is a first pre trace back unit and the second multiplexer 236 is a second pre trace back unit. The hybrid trace back apparatus according to the second embodiment performs a hybrid trace back scheme strongly combined with the register exchange method and the block trace back method under a structure including a path metric having a fully parallel add compare select structure using a Radix4. As described above, the trace back operations are performed twice in the buffer in the hybrid trace back apparatus according to the second embodiment. Accordingly, a delay time for decoding is reduced, and a performance is improved when a same block trace back memory is used since a trace back depth is extended effectively.

Figure 5:
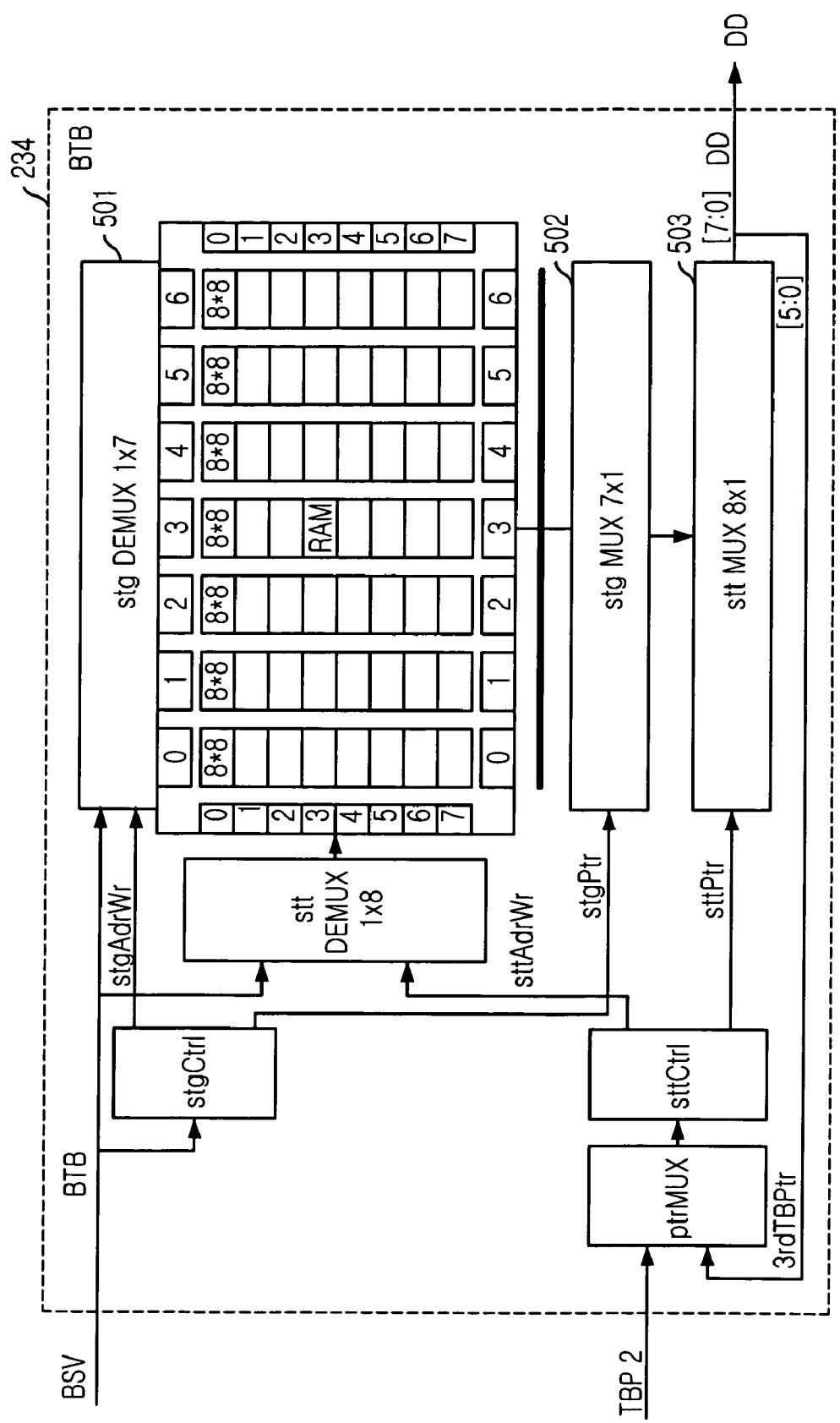
FIG. 5 is a block diagram depicting a trace back block (BTB) shown in FIGS. 3 and 4.

FIG. 5 is a block diagram depicting a trace back block (BTB) unit shown in FIGS. 3 and 4.

For convenience, there are several assumptions made as follows. At first, a constraint length is 7 and a Radix4 calculation is used, a unit of block trace back is 8 bits, and a trace back depth is a multiple of 8 bits. Accordingly, the number of states on the trellis diagram is 64 and a size of buffer is 512 bits which is obtained by "8 bits×64". And, four path metric calculations are performed since a size of survival path value is 2 bit which is provided from the path metric calculator 22 based on a Radix4 and a unit of block trace back is 8 bits. The depth of the block trace back memory is 56. There is a difference between a critical path of a PMC 22 having a fully parallel ACS and a critical path of the block trace back unit 234. Herein, it also assumes that an operation frequency of the block trace back unit 234 is twice faster than an operation frequency of the PMC 22.

The block trace back memory which is an inside memory of the block trace back (BTB) unit 234 is divided into 7 modules. Each module has 8 addresses and a data size of 64 bits. Therefore, single data bus has 8 state values.

At first, a write operation of the BTB unit 234 will be described hereinafter.

At step a), the block survival value (BSV) is divided 8 time through a state demultiplexer (stg DEMUX 1×7) 501 and stored in the block trace back memory of a stage 0.

At step b), the step a) is repeatedly performed while increasing the stage.

A read operation of the BTB unit 234 will be described hereinafter.

At step a), if the block trace back memory is filled until a stage 5, one of 7 memory blocks of the block trace back memory is selected as a stage multiplexer (stg MUX 7×1) 502 and 64 bits are outputted. At an initial time, a module of the stage 5 is selected.

At step b), a corresponding state value is selected among 8 state values included in the outputted 64 bits as a state multiplexer (stt MUX 8×1) 503, and then the selected 8 bits is used to below step.

At step c), lower 6 bits becomes a TBP of a next stage.

At step d), reduce one stage.

At step e), the steps a) to d) are repeatedly performed until the stage becomes 0.

At step f), 8 bits obtained at a final stage is decoded data (DD).

In the hybrid trace back apparatus according to the second embodiment, the RE buffer 232 for exchanging a register and the BTB buffer for buffering the BSV to store in the block trace back memory are used. Since two register modules are used for the buffers 232, 233, it may be a disadvantage of the second embodiment of the present invention. Therefore, another embodiment of the present invention using one buffer or singe register module will be described hereinafter.

Figure 6:
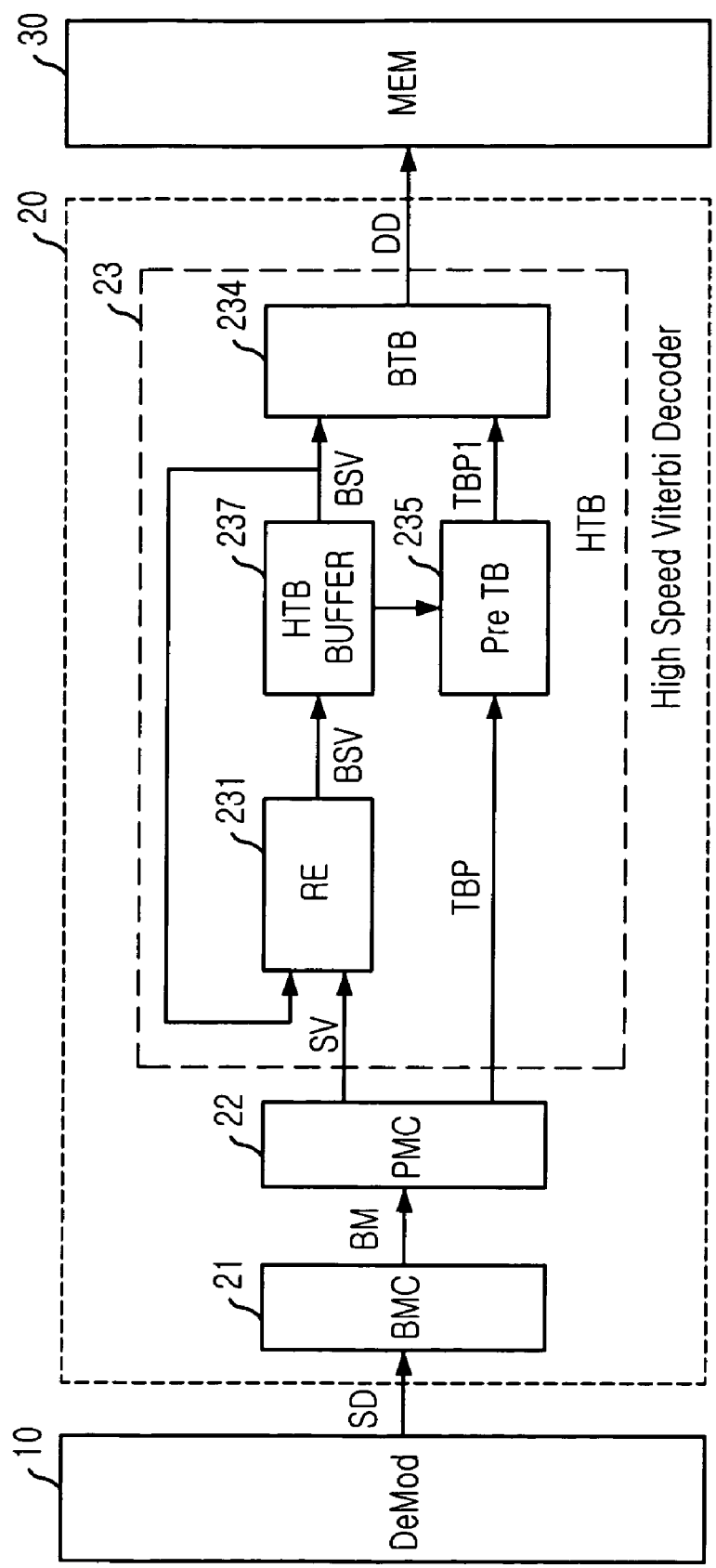
FIG. 6 is a block diagram illustrating a hybrid trace back apparatus and a high-speed Viterbi decoding system using the same in accordance with a third embodiment of the present invention.

Such an embodiment of the present invention using one register module is shown in FIG. 6.

FIG. 6 is a block diagram illustrating a hybrid trace back apparatus and a high-speed Viterbi decoding system using the same in accordance with a third embodiment of the present invention.

Referring to FIG. 6, a register exchange unit (RE) 231 performs a register exchange operation using a HTB buffer 237 which denotes a buffer for hybrid trace back. Herein, the HTB buffer 237 stores and outputs a block survival value (BSV) for simultaneously performing a register exchange operation. Also, the block trace back (BTB) unit 234 orderly read values stored in the HTB buffer 237 and stores the read values in a block trace back memory which is an inside memory of the BTB unit 234. Also, the HTB buffer 237 must provide the BSV to smoothly operate the BTB unit 234. Accordingly, the HTB buffer 237 provides a corresponding value to simultaneously operate the RE unit 231 and the BTB unit 234.

Therefore, the hybrid trace back apparatus according to the third embodiment of the present invention includes a register exchange unit (RE) 231 for receiving survivor values of each states, from the fully parallel path metric calculator 22, and obtaining a block survival value (BSV) through a register exchange as much as a bit length for block trace back; a HTB buffer 237 for storing and outputting the BSV to simultaneously perform a register exchange operation, and storing the BSV obtained through the register exchange (RE) until the BSV is written in a block trace back memory of a block trace back unit 234; and the block track back (BTB) unit 234 for obtaining the decoded data (DD) by performing a block trace back operation while writing the value of the HTB buffer 237 in the block trace back memory. The hybrid trace back apparatus according to the third embodiment performs a hybrid trace back scheme strongly combined with the register exchange method and the block trace back method under a structure including a path metric having a fully parallel add compare select structure using a Radix4. The hybrid trace back apparatus according to the third embodiment further includes a pre trace back unit (Pre TB) 238 for receiving a trace back pointer (TBP) from the fully parallel path metric calculator 22, calculating a first TBP (TBP1) using the BSV stored in the HTB buffer 237 and providing the TBP1 to the BTB unit 234.

Hereinafter, operations of the RE buffer 232 in the hybrid trace back apparatus using double buffers according to the first and the second embodiment of the present invention will be described with reference to the FIG. 7, and operations of the BTB buffer 233 in the hybrid trace back apparatus using double buffers according to the first and the second embodiment of the present invention will be described with reference to the FIG. 8.

For convenience, the above described assumptions are also applied inhere. That is, a constraint length is 7 and a Radix4 calculation is used, a unit of block trace back is 8 bits, and a trace back depth is a multiple of 8 bits. Accordingly, the number of states on the trellis diagram is 64 and a size of buffer is 512 bits which is obtained by "8 bits×64".

When different buffers are used for the RE buffer 232 and the BTB buffer 233, each buffer is independently operated.

A BSV of 2 bits per a state is outputted since a Radix4 is used, and 64 state values are outputted at once because of the fully parallel ACS. Therefore, a BSV of 64×2 bits is outputted.

Figure 7:
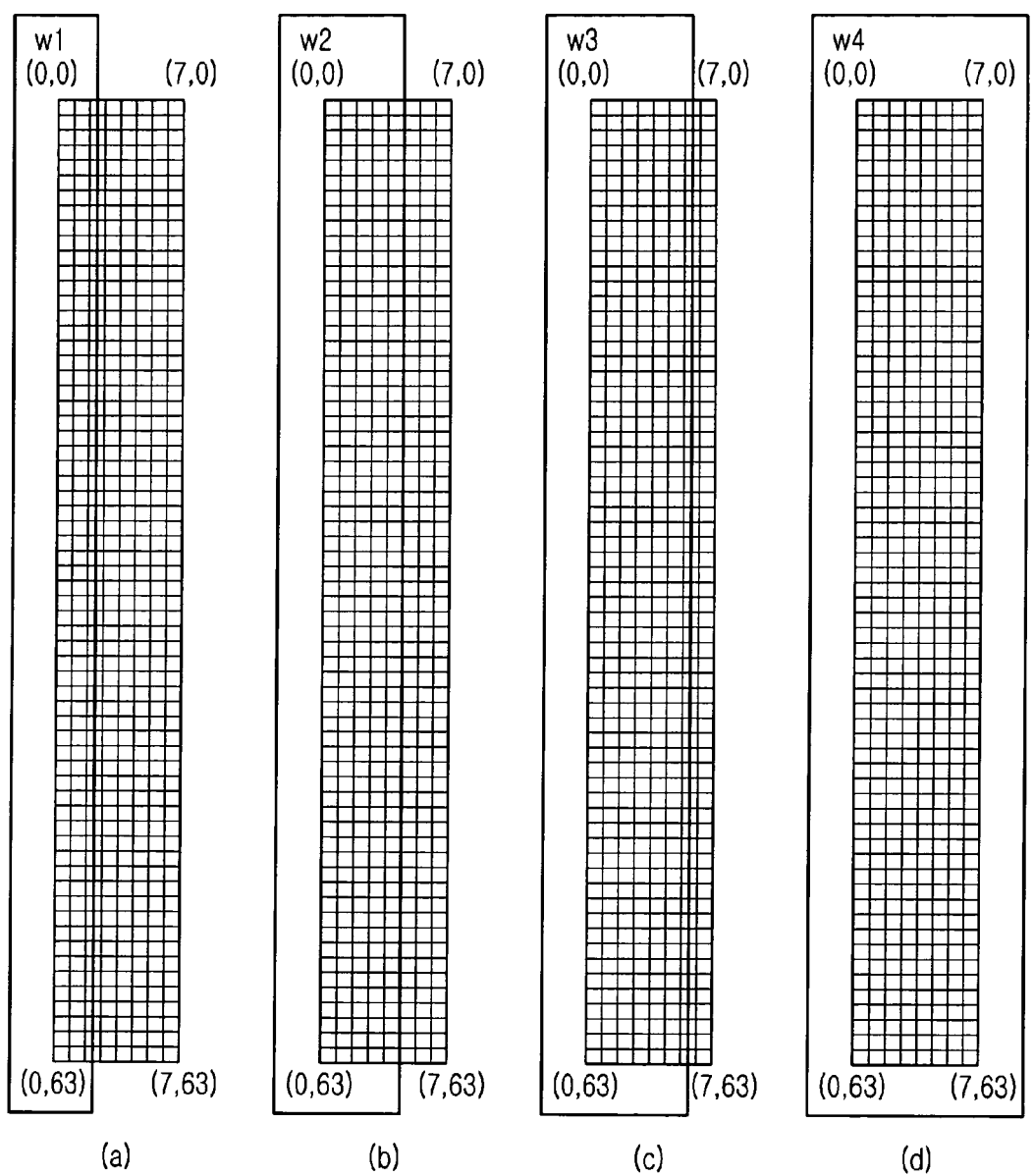
FIG. 7 shows a buffering operation for a register exchange when a hybrid trace back apparatus using a double buffer according to a first and a second embodiment of the present invention.

FIG. 7 shows operations of a RE buffer.

At first, a write operation of the RE buffer 232 will be described.

At step a), a value of 64×2 bits is stored as shown in (a) of FIG. 7.

At step b), a value of 64×4 bits is stored as shown in (b) of FIG. 7 by selecting a BSV of a previous block and a new BSV provided from the ACS.

At step c), a value of 64×6 bits is stored as shown in (c) of FIG. 7 by selecting a BSV of a previous block and a new BSV provided from the ACS.

At step d), a value of 64×8 bits is stored as shown in (d) of FIG. 7 by selecting a BSV of a previous block and a new BSV provided from the ACS.

At step e), the steps (a) to (d) are repeatedly performed.

Hereinafter, a read operation of the RE buffer 232 will be described.

Since all values are connected to the RE unit 231, a specific read operation is not required. When the step (d) of the write operation is completed, the result values are provided to the BTB buffer 233 shown in FIG. 8 at once.

Figure 8:
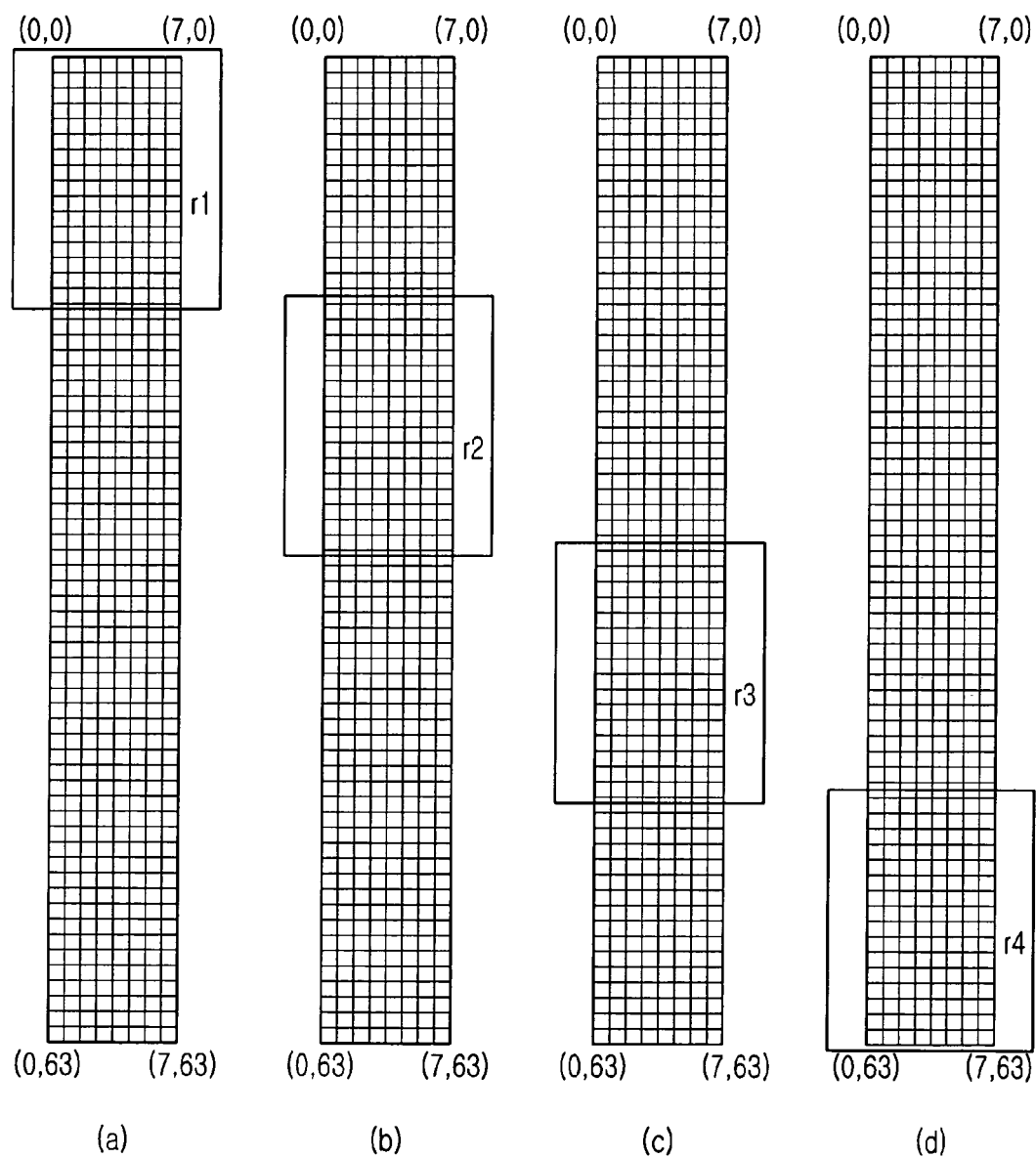
FIG. 8 shows buffering operation for a block trace back when a hybrid trace back apparatus using a double buffer according to a first and a second embodiment of the present invention.

FIG. 8 shows operations of a BTB buffer 233.

At first, a write operation of the BTB buffer 233 will be described.

At step a), four times of operations of the RE buffer 232 are completed, the result values are stored in the BTB buffer 232 at once.

At step b), the step a) is repeatedly performed.

Meanwhile, a read operation of the BTB buffer 233 will be explained.

At step a), 16×8 values are read from a state 0 address to a state 15 address and provided the 16×8 values to the BTB unit 234 as shown in (a) of FIG. 8 because all BSVs of single state of 8 bits must be stored in one address to perform the block trace back operation according to a method storing a value in the block trace back memory.

At step b), 16×8 values are read from a state 16 address to a state 31 address and provided the 16×8 values to the BTB unit 234 as shown in (b) of FIG. 8.

At step c), 16×8 values are read from a state 32 address to a state 47 address and provided the 16×8 values to the BTB unit 234 as shown in (c) of FIG. 8.

At step d), 16×8 values are read from a state 48 address to a state 63 address and provided the 16×8 values to the BTB unit 234 as shown in (d) of FIG. 8.

At step e), the steps a) to d) are repeatedly performed.

As shown above, it is impossible to be normally operated if the RE buffer 232 and the BTB buffer 233 are simply combined as single buffer. Therefore, the HTB buffer 237 according to the present invention is introduced by modifying a structure and a method for reading and writing as follows.

The HTB buffer 237 of 512 bits can be made to 16 modules based on BSV of 2 bits per a state and a register unit module of 32 bits. It can be expressed as 4×4 matrix shown in FIG. 9. A size of the matrix may be varied according to a configuration of hardware. Herein, it assumes that the square matrix is used.

Figure 9:
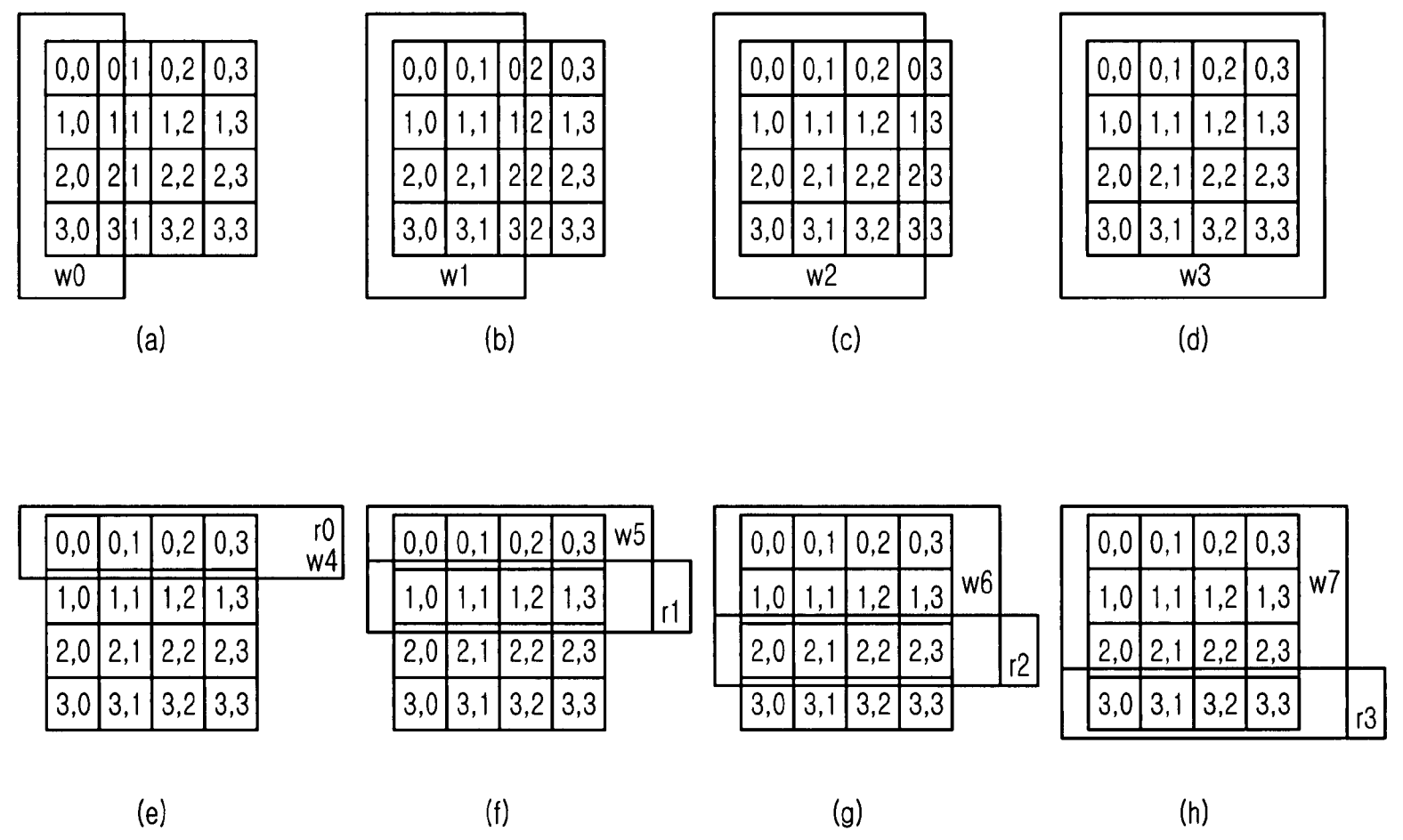

FIG. 9 shows operations of a HTB buffer when a hybrid trace back apparatus using single buffer according to a third embodiment of the present invention.

Referring to FIG. 9, write operation of the RE unit 231 is performed in a unit of a column and the HTB buffer 237 is completely filled up. At the same time, a read operation is also performed in a unit of a column for the register exchange operation.

When the HTB buffer 237 is completely filled up, a write operation for the block trace back memory is progress in a unit of row since it is treated as a unit of BSV of a state. According to progress this operation, the buffer 237 is empted in a unit of a row.

Therefore, the operation result of the register exchange unit 231 must be written in a unit of row. Herein, a read operation for the operation of the register exchange unit 231 is also performed in a unit of a row. When the HTB buffer 237 is filled up in a unit of a row, the block trace back memory must be filled up in a unit of a column. According to the above described operations, the buffer 237 is empted in a unit of a column, and a state of the buffer 237 returns to an original state.

By repeatedly performing the above described operations, the HTB buffer 237 can perform both operations of the RE buffer 232 and then BTB buffer 233.

Figure 10:
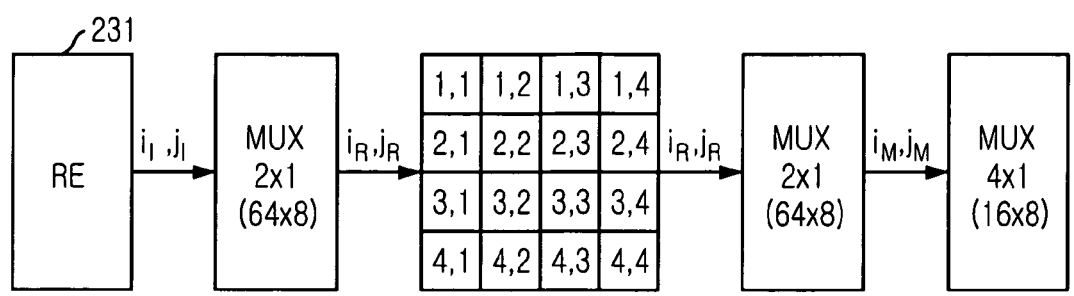
FIG. 10 is a block diagram illustrating a concept for configuring a double buffer as single buffer in accordance with a preferred embodiment of the present invention.

FIG. 10 is a block diagram illustrating a concept for configuring a double buffer as single buffer in accordance with a preferred embodiment of the present invention.

As shown in FIG. 10, it assumes that the register exchange unit 231 provides a BSV of $(i_I, t_I)$. Herein, $i_I$ is consisted of 32 bits and denotes a value obtained from 64 states divided by 16. That is, $i_I$ may be a value from 0 to 3. $t_I$ denotes a value of an input order and may be a value from 0 to 3 since a matrix of the buffer 237 is 4×4. Also, the buffer 237 is configured of 4×4 matrix, and it may be expressed as $(i_R, j_R)$ and has a value from 0 to 3.

The above described operation can be expressed as following mathematical equations. At first, a relation between an input of the buffer 237 and a matrix of a buffer 237 is shown in below Eq. 1 when data is inputted in a unit of a row.

$$i_R = i_I, j_R = t_I \bmod 4 \qquad \text{Eq. 1}$$

On the contrary, a relation between an input of the buffer 237 and a matrix equation of the buffer 237 is shown in below Eq. 2 when data is inputted in a unit of a column.

$$i_R = t_I \bmod 4, j_R = i_I \qquad \text{Eq. 2}$$

Meanwhile, it assumes that a value of (iM, tM) is provided from an external device of the buffer 237 after the row unit write operation is completed, a relation between the buffer 237 and then can be expressed as blow Eq. 3 when it provided as a first column unit.

$$i_M = j_R, (t_M \bmod 4) = i_R \qquad \text{Eq. 3}$$

On contrary, the relation can be expressed as blow Eq. 4 when it provided as a row unit.

$$i_M = i_R, (t_M \bmod 4) = j_R \qquad \text{Eq. 4}$$

Figure 11:
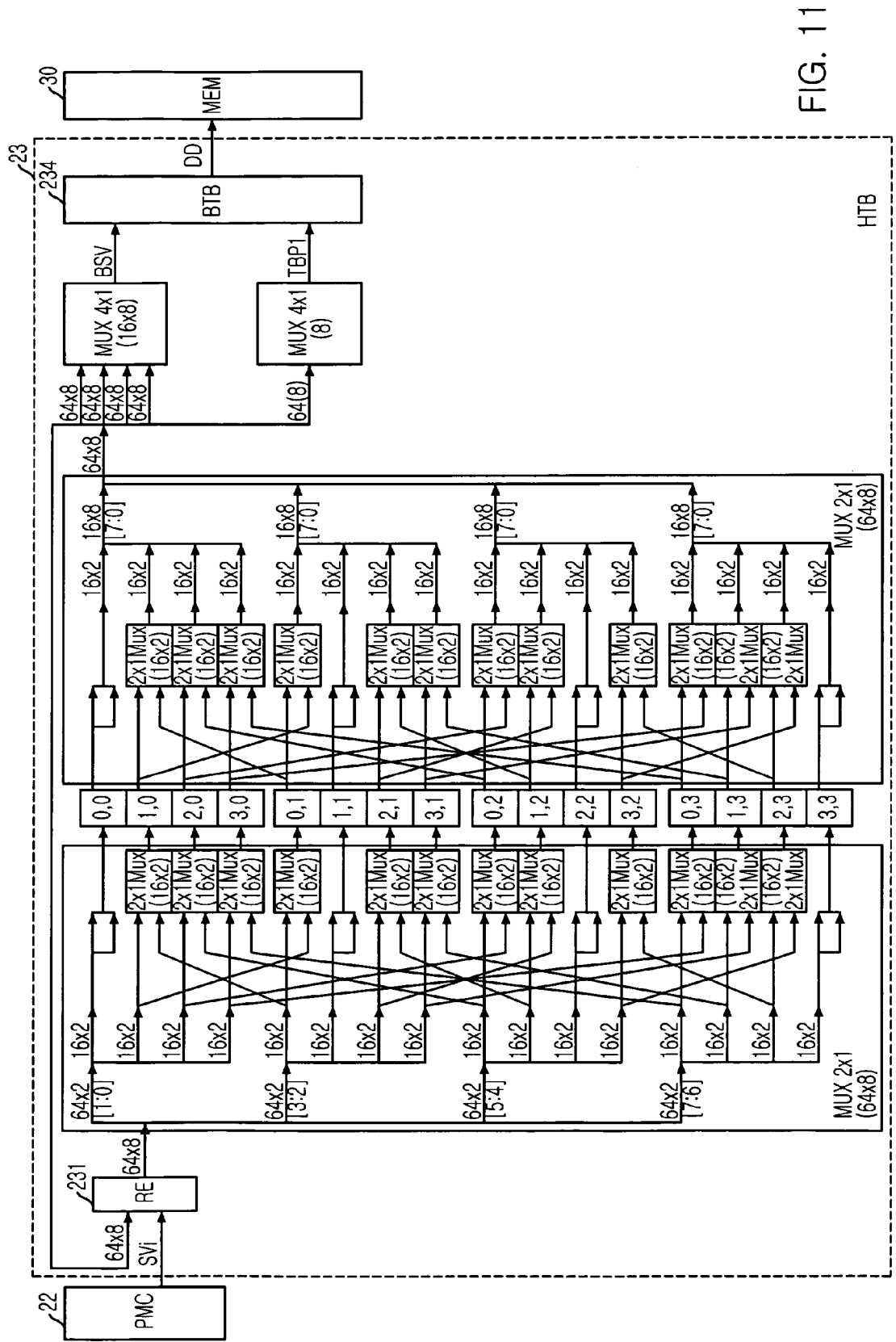
FIGS. 11 and 12 are views of hybrid trace back apparatus when a hybrid trace back apparatus according to the third embodiment uses single buffer.

Operations of the buffer 237 are shown in FIG. 11.

As shown in FIG. 11, a value provided from the register exchange unit 231 is not switched and is directly written in a register of the buffer 237 in a column unit operation. But, the value expressed in the equations is switched and then stored as shown in FIG. 11 for the row unit operation.

There are two types for reading the buffer 237. One type is for exchanging registers and another type is for providing the read data to the block trace back unit 234.

Herein, the read operation for exchanging a register is identically operated to a write operation of the register exchange unit. On contrary, the read operation for providing data to the block trace back unit 234 performs a row unit operation at first, and then, performs a column unit operation. Therefore, it is possible to use single buffer 237 instead of using the RE buffer and the BTB buffer if the column unit operation and the row unit operation are synchronized. Below table 1 shows detailed operation according to each step.

TABLE 1

| Step | Read RE module | Write RE module | Provide trace back module | FIG. 9 |
|---|---|---|---|---|
| 1 | Nop | Write a value of 64 x 2 bits at a column 0 | Nop | A |
| 2 | Read a value of 64 x 2 bits from a column 0 | Write a value of 64 x 2 x 2 bits at column 0, 1 | Nop | B |
| 3 | Read values of 64 x 2 x 2 bits from column 0 and 1 | Write a value of 64 x 2 x 3 bits at column 0, 1, 2 | Nop | C |
| 4 | Read values of 64 x 2 x 3 bits from column 0, 1 and 2 | Write a value of 64 x 2 x 4 bits at a column 0, 1, 2, 3 | Nop | D |
| 5 | Nop | Write a value of 64 x 2 bits at a row 0 | Read a value of row 0 and provide it to RAM | E |
| 6 | Read a value of 64 x 2 bits from a row 0 | Write a value of 64 x 2 x 2 bits at a row 0, 1 | Read a value of row 1 and provide it to RAM | F |
| 7 | Read values of 64 x 2 x 2 bits from row 0 and 1 | Write a value of 64 x 2 x 3 bits at row 0, 1, 2 | Read a value of row 2 and provide it to RAM | G |
| 8 | Read values of 64 x 2 x 3 bits from row 0, 1 and 2 | Write a value of 64 x 2 x 4 bits at row 0, 1, 2, 3 | Read a value of row 3 and provide it to RAM | H |
| 9 | Repeatedly perform the steps 1 to 8 | | | |

Figure 12:
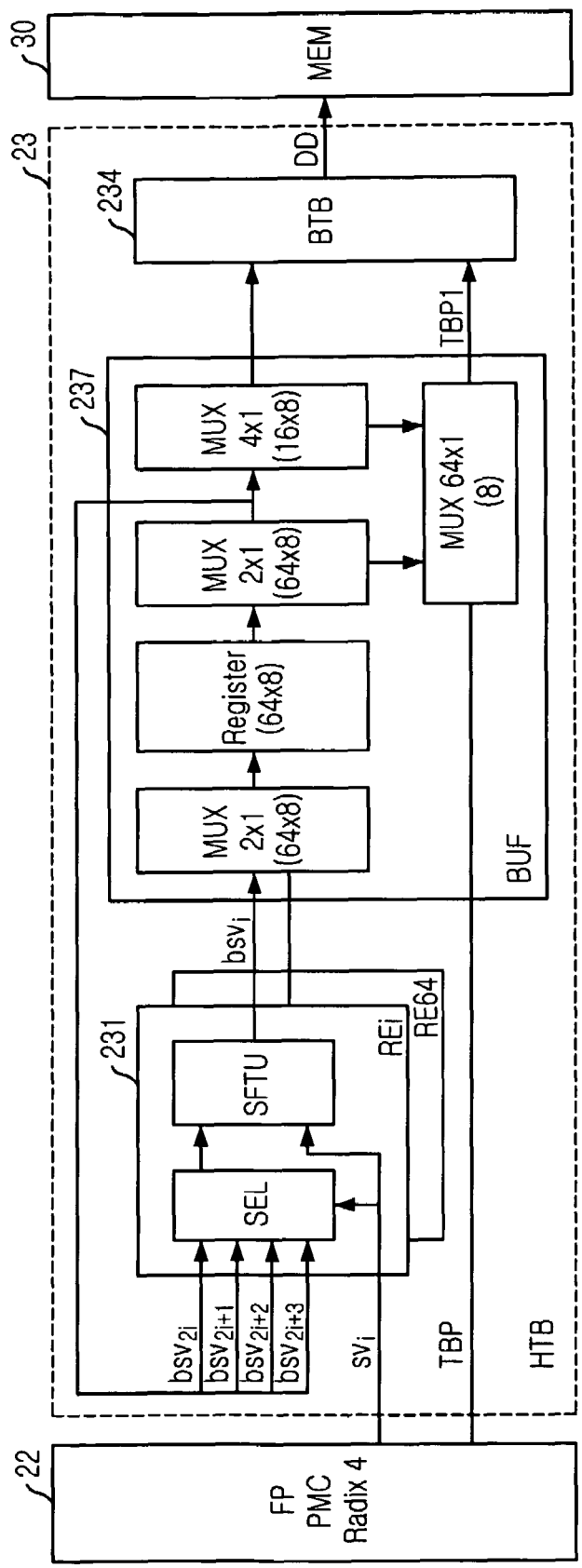

A structure for the operations is shown in FIG. 12.

As shown in FIG. 12, the register exchange unit 231 receives a survival value (SV) from the PMC 22 and performs a register exchange (RE) in a unit of two bits. When it is provided to the buffer 237, the buffer 237 is connected to an input/output of a register 64×8 according to a corresponding operation mode. Accordingly, a multiplexer performs a storing operation or a providing operation in the block trace back memory.

The survivor values are orderly provided from the multiplexer (MUX 4×1) to the block trace back unit 234 and a next trace back pointer is extracted using the multiplexer (MUX 64×1) at the same time.

The Viterbi decoding system having the hybrid trace back apparatus using single buffer 237 is shown in FIG. 6, and the Viterbi decoding system having the hybrid trace back apparatus using two buffers 232, 233 is shown in FIGS. 3 and 4.

As described above, the Radix4 based high-speed Viterbi decoding system having the hybrid trace back apparatus according to the present invention can decode a convolutional code having a constraint length of 7 or 9, which is used in a high-speed communication system.

The hybrid trace back apparatus according to the present invention effectively increase a trace back depth because a trace back operation is performed in a register exchange buffer using a trace back pointer value in a path metric, and another trace back operation is performed again in a corresponding buffer for storing values in the trace back memory to provide new trace back value although a general hybrid trace back method requires a register for performing a register exchange and another register for buffering while writing a value at a memory for a trace back operation and a general register exchange method does not perform a trace back operation.

Especially, the hybrid trace back apparatus according to the present invention may not require double buffer. That is, the hybrid trace back apparatus according to the present invention uses a single buffer for exchanging a register and for storing values in the block trace back memory.

Furthermore, the high-speed Viterbi decoding system having the hybrid trace back apparatus according to the present invention may use the trace back memory in less number of times than the conventional high-speed Viterbi decoder using multiple trace back pointers. Accordingly, the high-speed Viterbi decoding system consumes less amount of electric power because the less times of reading operations are performed.

The present invention contains subject matter related to Korean patent application No. KR 2004-0108282, filed in the Korean patent office on Dec. 17, 2004, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A Radlx4 based hybrid trace back apparatus having a fully parallel add compare select (ACS) structure, the hybrid trace back apparatus comprising:
 a register exchanging means for receiving survivor values of each state, from a path metric calculator, and obtaining a block survival value for a block trace back operation through a register exchange operation;
 a first storing means for the register exchange operation;
 a second storing means for storing the block survival value obtained through the register exchange operation until the block survival value is written in a block trace back memory; and
 a block trace back means for outputting decoded data by performing a block trace back operation while writing a value of the second storing means.

2. The hybrid trace back apparatus as recited in claim 1, further comprising:
 a first pre trace back means for receiving a trace back pointer (TBP) provided from the path metric calculator, calculating a first trace back pointer (TBP1) using a block survival value stored in the first storing means, and outputting the TBP1; and
 a second pre trace back means for receiving the TBP1 from the first pre trace back means, calculating a second trace back pointer (TBP2) using a block survival value stored in the second storing means, and providing the TBP2 to the block trace back means.

3. The hybrid trace back apparatus as recited in claim 1, wherein an operation frequency of the block trace back means is two times faster than an operation frequency of the Radix4 based path metric calculator by recognizing a difference between a critical path of the Radix4 based path metric calculator and a critical path of the block trace back means.

4. A Radix4 based hybrid trace back apparatus having a fully parallel add compare select (ACS) structure, the hybrid trace back apparatus comprising:
 a register exchanging means for receiving survivor values of each states, from a path metric calculator, and obtaining a block survival value for a block trace back operation through a register exchange operation;
 a storing means for storing and outputting a block survival value to perform the register exchange operation, and storing the block survival value obtained through the register exchange operation until the block survival value is written in a block trace back memory; and a block trace back means for outputting decoded data by performing a block trace back operation while writing a value of the second storing means.

5. The hybrid trace back apparatus as recited in claim 4, further comprising a pre trace back means for receiving a trace back pointer (TBP) provided from the path metric calculator, calculating a first trace back pointer (TBPI) using a block survival value in the storing means and outputting the TBP1 to the block trace back means.

6. The hybrid trace back apparatus as recited in claim 4, wherein the storing means performs a read operation for the register exchange operation identically to a write operation of the register exchange operation, and performs a read operation in a unit of a row and then performs a read operation in a unit of a column for providing values to the block trace back means, and then a synchronization process is performed between results of the read operations.

7. The hybrid trace back apparatus as recited in claim 6, wherein a write operation of the register exchange means is progressed in a unit of a column to fill up all buffers of the storing means, and a read operation for performing the register exchange operation is also performed in a unit of a column;

a write operation for writing values in an inside memory of the block trace back means is performed in a unit of a row after the buffer is completely filled up since it is processed as a unit of one state's survival path value, and the buffer is empted in a unit of a row by writing the values in the inside memory; and a read operation for the register exchange operation is performed in a unit of a row since the result of the register exchange means must be written in a unit of a row, a write operation for writing values In the inside memory of the block trace back means is performed in a unit of a column when the buffer is filled up in a unit of a row, the buffer is empted by writing the values in the inside memory and a state of the buffer returns to an original state in order to merge a buffer used for the register exchange and a buffer used for the block trace back to single buffer.

8. A Radix4 based high-speed Viterbi decoding system for performing a trace back operation, comprising:

a register exchanging means for receiving survivor values of each state, from a path metric calculator, and obtaining a block survival value for a block trace back operation through a register exchange operation;

a first storing means for the register exchange operation;

a second storing means for storing the block survival value obtained through the register exchange operation until the block survival value is written in a block trace back memory; and a block trace back means for outputting decoded data by performing a block trace back operation while writing a value of the second storing means, wherein the Radix4 based high-speed Viterbi decoding system decodes a convolutional code having a constraint length of 7 or 9 through a hybrid trace back operation combined with a register exchange and a block trace back having a fully parallel add compare select (ACS) path metric structure.

9. The high-speed Viterbi decoding system as recited in claim 8, wherein the path metric receives and adds four previous path metric values and four branch metric values, a selected branch is assigned as a survival value of the state, and uses a state having a minimum path metric in a stage as an initial value.

\* \* \* \* \*